(12) United States Patent
Kao et al.

(10) Patent No.: US 12,300,294 B2
(45) Date of Patent: May 13, 2025

(54) CANTILEVER NANOELECTROMECHANICAL DECODER CIRCUIT AND METHODS FOR FORMING THE SAME

(71) Applicant: Taiwan Semiconductor Manufacturing Company Limited, Hsinchu (TW)

(72) Inventors: Yun-Feng Kao, New Taipei (TW); Katherine H. Chiang, New Taipei (TW); Jyun-Yan Kuo, Hsinchu (TW); Wei Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 239 days.

(21) Appl. No.: 18/295,276

(22) Filed: Apr. 4, 2023

(65) Prior Publication Data

US 2024/0339142 A1    Oct. 10, 2024

(51) Int. Cl.
*G11C 11/00* (2006.01)
*G11C 11/16* (2006.01)
*H01H 1/00* (2006.01)
*H10B 61/00* (2023.01)

(52) U.S. Cl.
CPC ........ *G11C 11/1653* (2013.01); *H01H 1/0094* (2013.01); *H10B 61/00* (2023.02)

(58) Field of Classification Search
CPC .................... G11C 11/1653; H10B 61/00
See application file for complete search history.

(56) References Cited

U.S. PATENT DOCUMENTS

| 11,081,493 B2* | 8/2021 | Lai | ............ H10B 43/10 |
| 11,164,872 B1* | 11/2021 | Pulugurtha | ............ H10B 12/05 |
| 2008/0144364 A1 | 6/2008 | Lee et al. | |
| 2009/0129139 A1 | 5/2009 | Kam et al. | |
| 2022/0359567 A1* | 11/2022 | Pekny | ............ H10B 43/10 |

FOREIGN PATENT DOCUMENTS

| CN | 1599939 A | 3/2005 |
| CN | 107210264 A | 9/2017 |
| TW | 1361504 B | 4/2012 |

OTHER PUBLICATIONS

Jianq Chyun Intellectual Property Office; TW Application No. 112118509; office action mailed Apr. 29, 2024; 14 pages.

* cited by examiner

*Primary Examiner* — Pho M Luu
(74) *Attorney, Agent, or Firm* — The Marbury Law Group, PLLC

(57) ABSTRACT

A device structure includes a two-dimensional array of memory cells embedded in a memory-level dielectric layer and overlying a substrate; first access lines electrically connected to a respective row of memory cells within the two-dimensional array; and a first decoder circuit including first cantilever nanoelectromechanical devices that overlie the two-dimensional array of memory cells, are embedded in upper dielectric material layers, and have output nodes that are electrically connected to a respective first access line selected from the first access lines.

20 Claims, 15 Drawing Sheets

CANTILEVER NANOELECTROMECHANICAL DECODER CIRCUIT AND METHODS FOR FORMING THE SAME

BACKGROUND

Nanoelectromechanical devices may control signals based on nanoscale movement of mechanical elements under electrical bias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
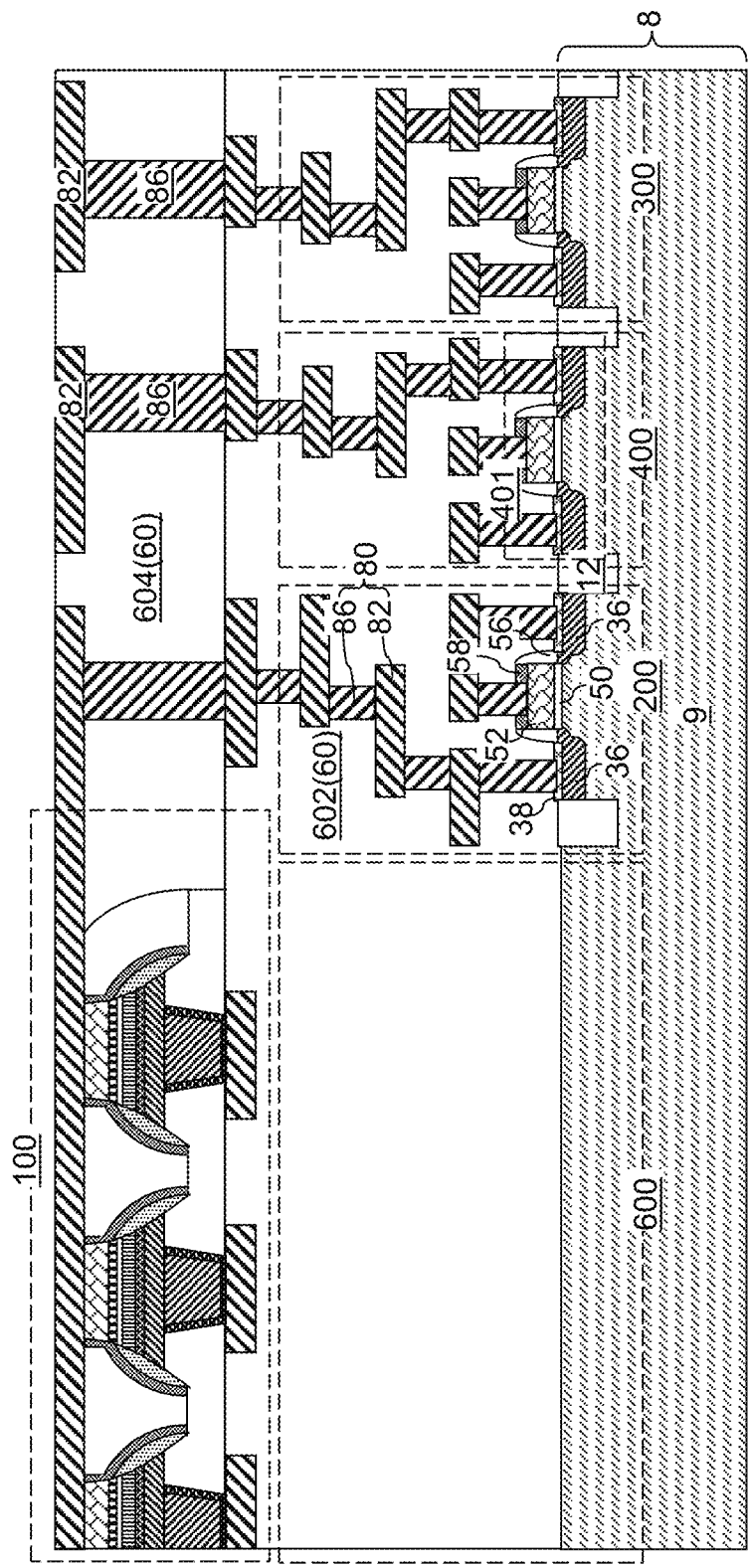
FIG. 1A is a vertical cross-sectional view of an exemplary structure after formation of semiconductor devices, metal interconnect structures, and a two-dimensional array of memory cells and access lines according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Embodiments of the present disclosure are directed to a capacitor circuit providing self-adjusting capacitance and methods for forming the same. An optimal value is preferred for the capacitance of a decoupling capacitor in order to provide an optimal level of decoupling capacitance. Excessively large values or small values for the decoupling capacitance may adversely impact performance of a semiconductor circuit. Inherent wafer-to-wafer variations and within-wafer variations of process parameters for a capacitor circuit may lead to large variations in the decoupling capacitance. Such process parameters may include, but are not limited to, thicknesses and material compositions of various films used to form a decoupling capacitor.

It may be desirable to randomly access individual memory cells in a two-dimensional array of memory cells in a random access memory device. Word line decoders and bit line decoders take up large device area at the level of field effect transistors. Thus, incorporation of a two-dimensional array of memory cells in an interconnect level necessitates allocation of a large area for the word line decoders and bit line decoders in related art.

According to an aspect of the present disclosure, cantilever nanoelectromechanical (NEM) devices may be formed in an interconnect level to provide bit line decoders and/or word line decoders for a two-dimensional array of memory cells. The cantilever NEM devices may use a hybrid logic gate to provide an activation voltage to each of the bit lines and word lines. The cantilever NEM devices may be implemented, for example, at the topmost interconnect level. A limited number of address buffer transistors may be used at the transistor level on a top surface of a semiconductor layer to provide address signals, which are transmitted to the cantilever NEM-based decoder circuits to activate a selected bit line and/or a selected word line, thereby enabling random access of each of the memory cells. Further, the cantilever NEM devices of the present disclosure allows memory "function" level performance validation for address decoder circuits with minimal use of complementary metal-oxide-semiconductor (CMOS) devices. In some embodiments, one-time-programmable memory cells (such as fuses or antifuses) may be used in the memory array. In some embodiments, test structures may be designed with enhanced array and function coverage at a lower area overhead. Generally, by forming a decoder circuit in an interconnect level, a large device area for forming transistors become available on the surface of a semiconductor material layer in the substrate. The various embodiments of the present disclosure are now described with reference to accompanying drawings.

Figure 1B:
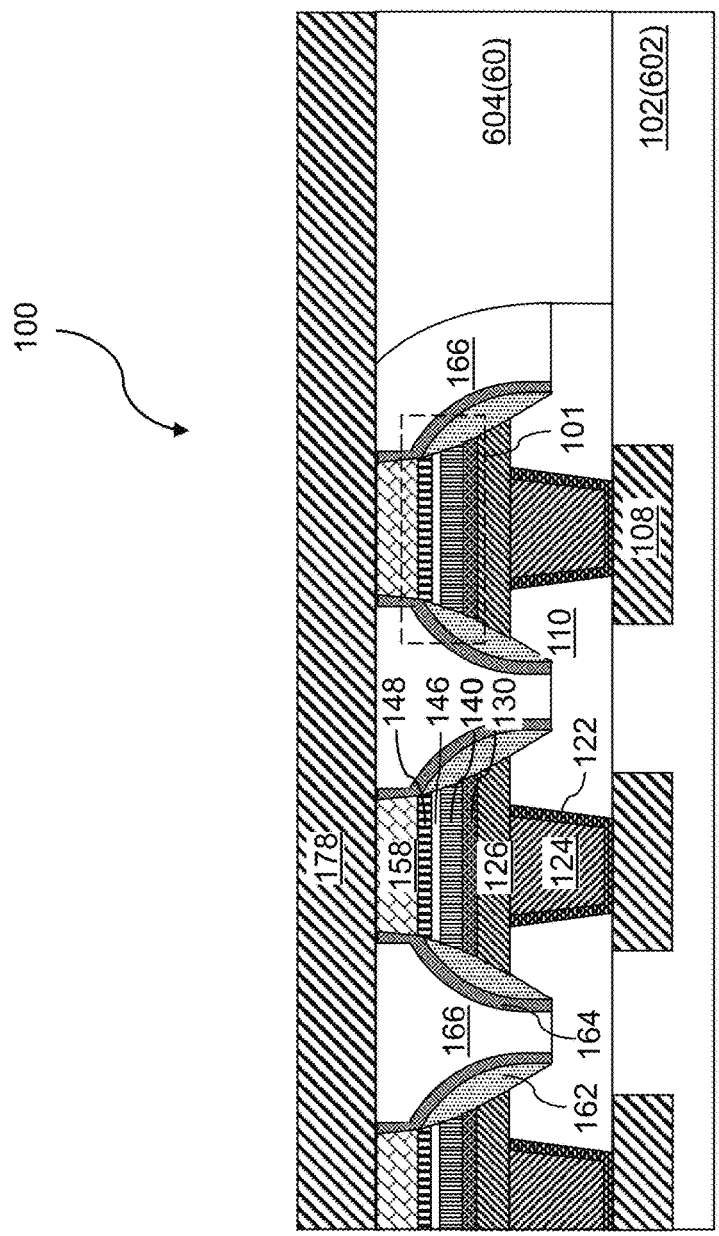
FIG. 1B is magnified view of a region including the two-dimensional array of memory cells in FIG. 1A.

Referring to FIGS. 1A and 1B, an exemplary structure according to an embodiment of the present disclosure is illustrated. The exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 12 including a dielectric material such as silicon oxide may be formed in an upper portion of the semiconductor material layer 9. Suitable doped semiconductor wells, such as p-type wells and n-type wells, may be formed within areas that are laterally enclosed by a respective subset of the shallow trench isolation structures 12. Semiconductor devices including, but not limited to, complementary metal-oxide-semiconductor (CMOS) field effect transistors may be formed in an upper portion of the semiconductor material layer 9. Each CMOS field effect transistor may comprise a respective pair of active regions 36 (such as a pair of a source region and a drain region), a gate dielectric 50, a gate electrode 52, an optional dielectric gate cap 58, and an optional dielectric gate spacer 56. Optionally, metal-semiconductor-alloy portions 38 (such as metal silicide portions) may be formed on the active regions 36 and/or the gate electrodes 52. The shallow trench isolation structures 12 may provide electrical isolation among the various semiconductor devices on the semiconductor material layer 9.

Dielectric material layers 60 and metal interconnect structures (82, 88) may be formed above the CMOS field effect transistors. Dielectric material layers 60 and metal interconnect structures 80 may be formed above the CMOS field effect transistors. The metal interconnect structures 80 may comprise metal line structures 82 and metal via structures 86. The metal interconnect structures 80 may be used to provide electrical wiring for the various semiconductor devices on the semiconductor material layer 9. The dielectric material layers 60 may comprise lower-level dielectric material layers 602 embedding a subset of the metal interconnect structures 80 that provide electrical wiring among the semiconductor devices located on a top surface of the semiconductor material layer 9, and a memory-level dielectric material layer 604 that laterally surrounds a two-dimensional array of memory cells 101 that overlies the lower-level dielectric material layers 602 and laterally surrounding the two-dimensional array of memory cells 101.

The exemplary structure may comprise various device regions. For example, the various device regions may include a non-memory device region 600 containing a first upper portion of the semiconductor material layer 9 and a subset of the metal interconnect structures 80 that may be embedded within a portion of the lower-level dielectric material layers 602 overlying the first upper portion of the semiconductor material layer 9. Further, the various device regions may include a sense amplifier region 200 containing a second upper portion of the semiconductor material layer 9 and a subset of the metal interconnect structures 80 that may be embedded within a portion of the lower-level dielectric material layers 602 overlying the second upper portion of the semiconductor material layer 9. In addition, the various device regions may include an address buffer region 400 containing a third portion of the semiconductor material layer 9 and a subset of the metal interconnect structures 80 that may be embedded within a portion of the lower-level dielectric material layers 602 overlying the third upper portion of the semiconductor material layer 9. Further, the various device regions may optionally include a power supply region 300 containing a fourth portion of the semiconductor material layer 9 and a subset of the metal interconnect structures 80 that may be embedded within a portion of the lower-level dielectric material layers 602 overlying the fourth upper portion of the semiconductor material layer 9. The region including the two-dimensional array of memory cells 101 is herein referred to as a memory array region 100.

The non-memory device region 600 may comprise field effect transistors for any non-memory device and may optionally include other semiconductor devices such as passive devices. Generally, the non-memory device region 600 may include any device that is not directly related to the two-dimensional array of memory cells 101. In one embodiment, the non-memory device region 600 may comprise logic devices for a logic circuitry for a system-on-a-chip (SoC) semiconductor die.

The sense amplifier region 200 includes field effect transistors that form sense amplifiers. The sense amplifiers may be electrically connected to the bit lines (which may comprise first access lines 178) of the two-dimensional array of memory cells 101. The address buffer region 400 may include address buffer transistors 401 that may transmit the bit line address and the word line address of a selected memory cell to cantilever nanoelectromechanical (NEM) devices to be subsequently formed. The power supply region 300 may include field effect transistors that provide power supply voltages for various other circuits on the semiconductor material layer 9.

In one embodiment, the semiconductor material layer 9 may include a single crystalline silicon layer, and the field effect transistors may include a respective portion of the single crystalline silicon layer as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

Referring to FIG. 1B, generally, a two-dimensional array of memory cells 101 and access lines (178, 108) may be formed over a substrate 8. The access lines (178, 108) may comprise first access lines 178 and second access lines 108. The first access lines 178 may comprise bit lines or word lines, and the second access lines 108 may comprise word lines or bit lines. In one embodiment, the first access lines 178 may comprise bit lines and the second access lines 108 may comprise word lines. Alternatively, the first access lines 178 may comprise word lines and the second access lines 108 may comprise bit lines. In one embodiment, the first access lines 178 may be electrically connected to a respective row of memory cells 101 within the two-dimensional array of memory cells 101, and the second access lines 108 may be electrically connected to a respective column of memory cells 101 within the two-dimensional array of memory cells 101.

Generally, any type of memory cells known in the art may be used for the memory cells 101 in the two-dimensional array of memory cells 101. In one embodiment, the memory cells 101 of the present disclosure may be selected from dynamic random access memory cells; resistive random access memory cells; magnetic tunnel junction random access memory cells; and ferroelectric random access memory cells.

In an illustrative example, an embodiment is described herein in which the two-dimensional array of memory cells 101 includes magnetic tunnel junction memory cells. In this embodiment, the second access lines 108 may be formed within a line-level dielectric layer 102, which may be a topmost dielectric layer selected from the lower-level dielectric material layers 602. A connection-via-level dielectric layer 110 may be formed over the second access lines 108. A two-dimensional array of via cavities may be formed through the connection-via-level dielectric layer 110. A column of via cavities may be formed over each second access line 108. A metallic barrier layer and a metallic fill material may be deposited in the via cavities, and excess portions of the metallic fill material and the metallic barrier layer may be removed from above the horizontal plane including the top surface of the connection-via-level dielectric layer 110. Each remaining portion of the metallic fill material and the metallic barrier layer that fills a respective via cavity constitutes a connection via structure (122, 124). A two-dimensional array of connection via structures (122, 124) may be formed through the connection-via-level dielectric layer 110. Each column of connection via structures (122, 124) may contact the top surface of a respective second access line 108. Each connection via structure (122, 124) may comprise a combination of a metallic barrier liner 122 and a metallic fill material portion 124.

A bottom electrode material layer, a memory material layer stack, and a top electrode material layer may be formed over the connection-via-level dielectric layer 110 and the two-dimensional array of connection via structures (122, 124). The bottom electrode material layer includes at least one nonmagnetic metallic material. The memory material layer stack may include, from bottom to top, an optional nonmagnetic metallic buffer material layer, a synthetic antiferromagnet layer, a nonmagnetic tunnel barrier material layer, and a free magnetization material layer. The top electrode material layer includes a top electrode material, which may include any nonmagnetic material that may be used for the bottom electrode material layer.

The top electrode material layer may be patterned by applying a photoresist layer over the top electrode material layer and patterning the photoresist layer into a two-dimensional array of discrete photoresist material portions, and by transferring the pattern in the photoresist layer through the top electrode material layer using an anisotropic etch process. The photoresist layer may be subsequently removed, for example, by ashing. Patterned portions of the top electrode material layer constitute a two-dimensional array of top electrodes 158.

The memory material layer stack and the bottom electrode material layer may be patterned by performing an ion beam etch (IBE) process that transfers the pattern in the top electrodes 158 through the memory material layer stack and the bottom electrode material layer. Each patterned portion of the memory material layer stack constitutes a memory cell 101, which is a magnetic tunnel junction (MTJ) memory cell. Each patterned portion of the bottom electrode material layer constitutes a bottom electrode 126. Each MTJ memory cell may include a bottom electrode 126, a magnetic tunnel junction structure (140, 146, 148), and a top electrode 158. Each memory element 101 may include an optional nonmagnetic metallic buffer layer 130 and a magnetic tunnel junction structure (140, 146, 148). Each magnetic tunnel junction (140, 146, 148) may include a synthetic antiferromagnet (SAF) structure 140, a nonmagnetic tunnel barrier layer 146, and a free magnetization layer 148.

At least one dielectric spacer (162, 164) may be formed around each memory cell 101. A dielectric encapsulation structure 166 may be formed around the two-dimensional array of memory elements 101. The memory-level dielectric material layer 604 may be deposited and planarized to provide a horizontal top surface. The first access lines 178 may be formed in an upper portion of the memory-level dielectric material layer 604 such that each first access line 178 contacts a row of top electrodes 158. The first access lines 178 may be formed as bit lines or as word lines.

Figure 2:
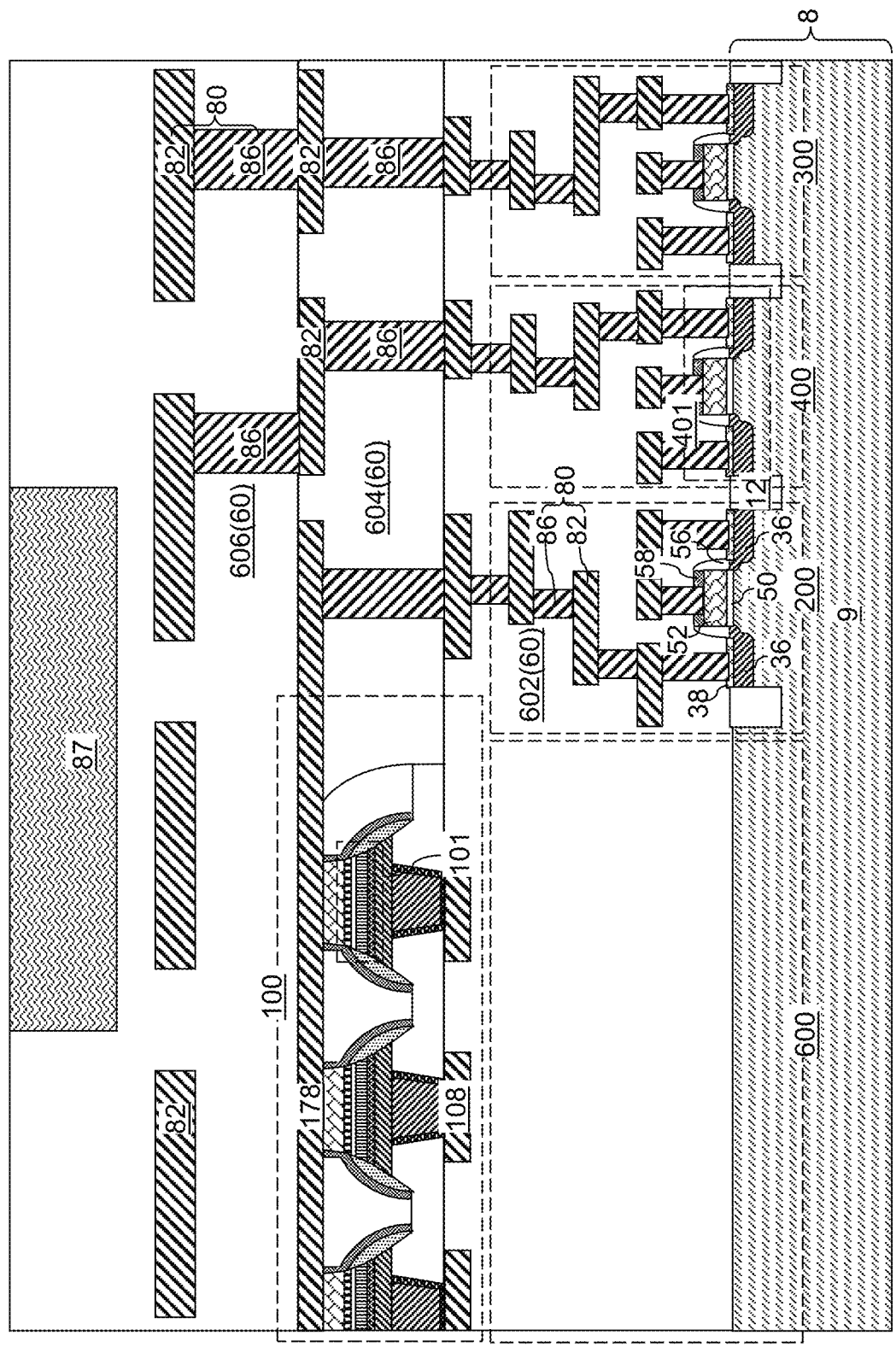
FIG. 2 is a vertical cross-sectional view of the exemplary structure after formation of upper-level dielectric material layers and sacrificial material portions according to an embodiment of the present disclosure.

Referring to FIG. 2, additional dielectric material layers 60 are formed over the two-dimensional array of memory cells 101. The additional dielectric material layers 60 are herein referred to as upper-level dielectric material layers 606. The upper-level dielectric material layers 606 comprise interlayer dielectric (ILD) materials such as undoped silicate glass, a doped silicate glass, or silicon nitride. Additional metal interconnect structures 80 are formed in the upper-level dielectric material layers 602. The additional metal interconnect structures 80 may be configured to provide electrical wiring for cantilever nanoelectromechanical devices to be subsequently formed.

According to aspect of the present disclosure, cavities may be formed in the topmost dielectric material layer selected from the upper-level dielectric material layers 606, for example, by applying and patterning a photoresist layer over the topmost dielectric material layer, and by transferring the pattern in the photoresist layer into the topmost dielectric material layer by performing an anisotropic etch process. The photoresist layer may be subsequently removed, for example, by ashing. The cavities may be subsequently filled with a sacrificial fill material to form sacrificial material portions 87. The sacrificial material portions 87 comprise materials that may be subsequently removed selective to the material(s) of the upper-level dielectric material layers 606. In one embodiment, the sacrificial material portions 87 may comprise a semiconductor material (such as silicon or a silicon-germanium alloy) or a dielectric material (such as porous organosilicate glass, a polymer material, amorphous carbon, diamond-like carbon (DLC), etc.). Top surfaces of the sacrificial material portions 87 may be formed in the horizontal plane including the topmost surface of the upper-level dielectric material layers 606. Generally, the sacrificial material portions 87 may be formed within upper portions of the upper-level dielectric material layers 606. The shapes of the sacrificial material portions 87 may be the same as the shapes of cavities to be used to contain movable portions of cantilevers to be subsequently formed as components of the cantilever nanoelectromechanical devices. The thickness (i.e., the height) of the sacrificial material portions 87 may be in a range from 50 nm to 1,000 nm, such as from 100 nm to 500 nm, although lesser and greater thicknesses may also be used.

Figure 3:
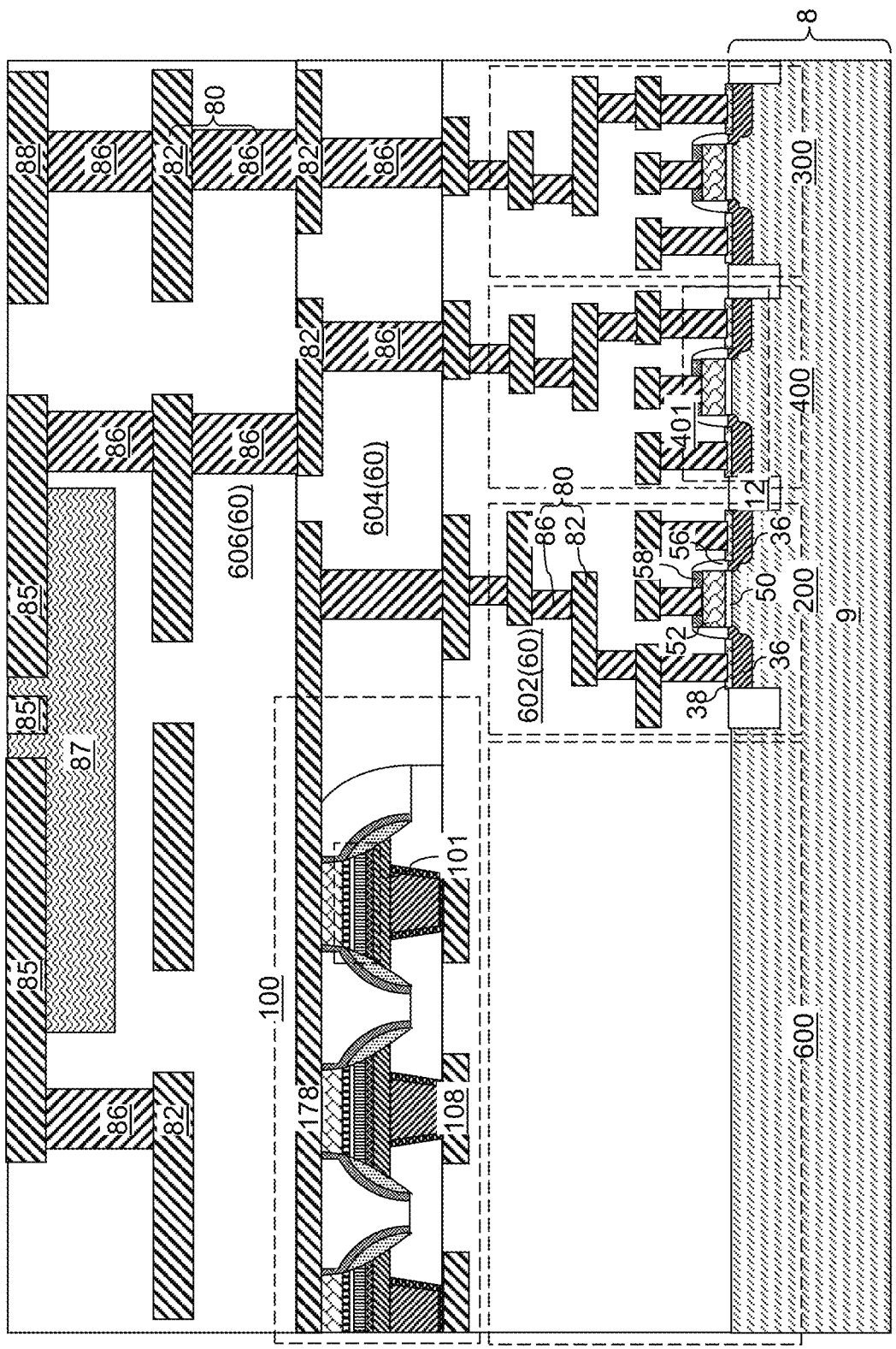
FIG. 3 is a vertical cross-sectional view of the exemplary structure after formation of metallic structures of gated nanoelectromechanical switches according to an embodiment of the present disclosure.

Referring to FIG. 3, via cavities and line cavities may be formed in the topmost dielectric material layer of the upper-level dielectric material layers 606 and in the sacrificial material portions 87. For example, a first photoresist layer may be applied over the upper-level dielectric material layers 606 and the sacrificial material portions 87, and may be lithographically patterned to form discrete openings (such as circular openings) therein. A first anisotropic etch process may be performed to form via cavities through the topmost dielectric material layer on a top surface of a respective one of the metal line structures 82 embedded within the upper-level dielectric material layers 606. The first photoresist layer may be subsequently removed, for example, by ashing. A second photoresist layer may be applied over the upper-level dielectric material layers 606 and the sacrificial material portions 87, and may be lithographically patterned to form line-shaped openings therein. A second anisotropic etch process may be performed to form line cavities in an upper portion of the topmost dielectric material layer of the upper-level dielectric material layers 606 and in upper portions of the sacrificial material portions. The second photoresist layer may be subsequently removed, for example, by ashing.

At least one metallic material may be deposited in the via cavities and in the line cavities, and excess portions of the at least one metallic material may be removed from above the horizontal plane including the topmost surface of the upper-level dielectric material layers 606 by a planarization process, which may use a chemical mechanical polishing process. Remaining portions of the at least one metallic material that fill the via cavities constitute additional metal via structures 86. Remaining portions of the at least one metallic material that fill the line cavities comprise nanoelectromechanical device-level (NEM device-level) metal line structures 85, which are components of gated nanoelectromechanical switches. The NEM device-level metal line structures 85 may comprise cantilever metallic structures that are formed partly in a respective one of the sacrificial material portions 87, and NEM device-level metal lines that are embedded in the upper-level dielectric material layers 606. A subset of the NEM device-level metal lines may contact a respective one of the sacrificial material portions 87. Additional remaining portions of the at least one metallic material embedded in the upper-level dielectric material layers 606 may comprise metallic bonding structures 88, which may be, for example, C4 bonding pads.

Figure 4:
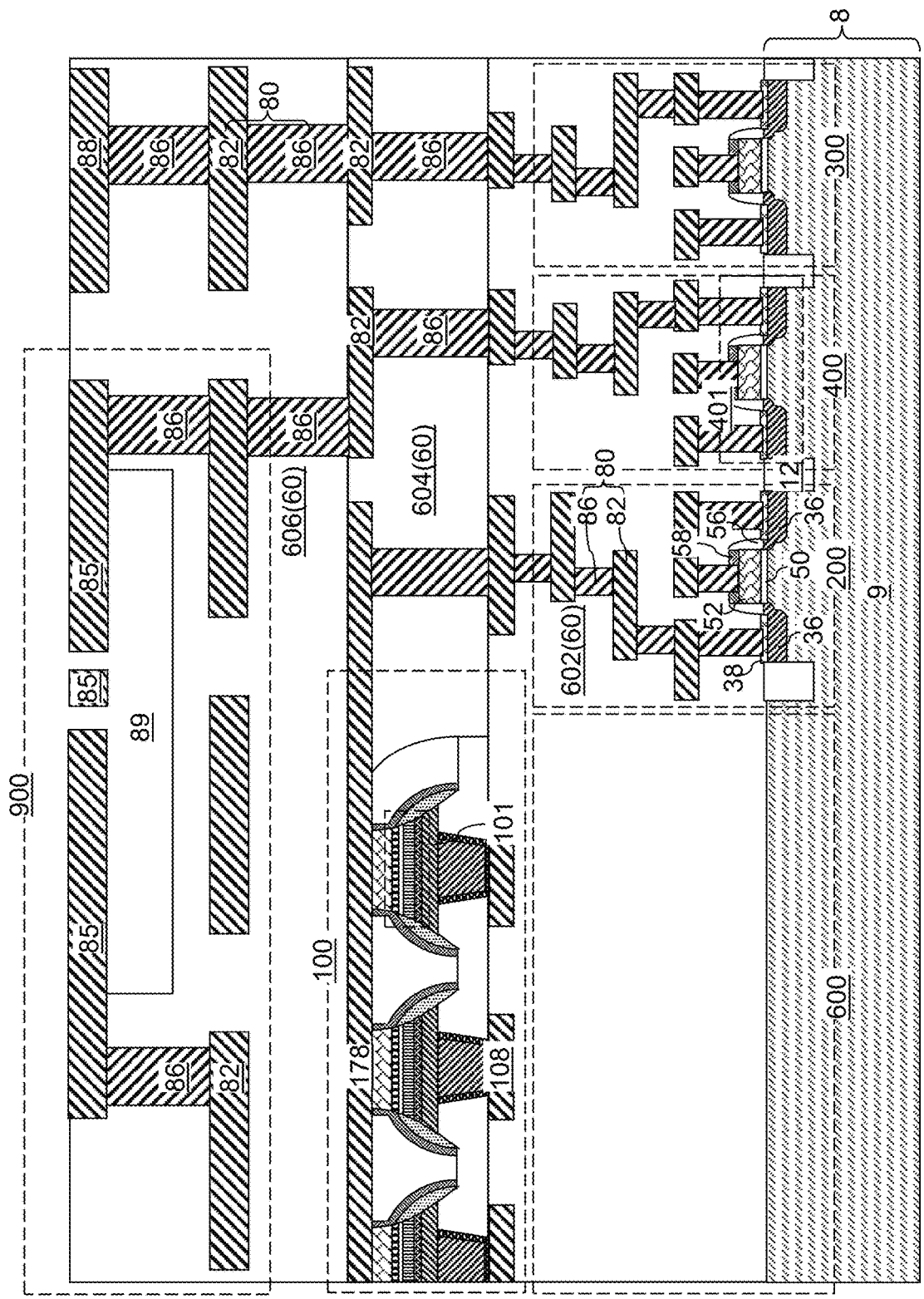
FIG. 4 is a vertical cross-sectional view of the exemplary structure after formation of cavities of the gated nanoelectromechanical switches according to an embodiment of the present disclosure.

Referring to FIG. 4, the sacrificial material portions 87 may be removed selective to the materials of the upper-level dielectric material layers 606, the NEM device-level metal line structures 85, and the metallic bonding structures 88. In an illustrative example, in embodiments in which the sacrificial material portions 87 comprise a semiconductor material such as amorphous silicon or polysilicon, a wet etch process using tetramethylammonium hydroxide (TMAH) may be used to remove the sacrificial material portions 87 selective to the materials of the upper-level dielectric material layers 606, the NEM device-level metal line structures 85, and the metallic bonding structures 88. Cavities may be formed in volumes from which the sacrificial material portions 87 are removed. The cavities are herein referred to as nanoelectromechanical (NEM) cavities 89.

Upon removal of the sacrificial material portions 87, free ends of the cantilever metallic structures are exposed to NEM cavities 89. The combination of the NEM device-level metal line structures 85 and the NEM cavities 89 constitute nanoelectromechanical devices. The region in which the nanoelectromechanical devices are provided is herein referred to as a nanoelectromechanical (NEM) device region 900. A subset of the NEM device-level metal line structures 85 including a respective predominant portion located in a respective one of the NEM cavities 89 may comprise cantilever metallic structures. The cantilever metallic structures are movable metallic structures that may deform by bending in response to an external electrical bias that is applied to a respective stationary metallic structure (such as a gate electrode structure) that is one of the NEM device-level metal line structure 85. The stationary metallic structures are embedded in the upper-level dielectric material layers 606 in a manner that is not conducive to bending or deformation. In one embodiment, one, a plurality, and/or each, of the nanoelectromechanical (NEM) devices may comprise a respective cantilever metallic structure and at least one stationary metallic structure. In embodiments in which an NEM device includes a cantilever metallic structure, such an NEM device is herein referred to as a cantilever nanoelectromechanical (NEM) device. According to an aspect of the present disclosure, one, a plurality, and/or each, of the cantilever NEM devices may comprise a respective plurality of cantilever gated nanoelectromechanical switches including a respective cantilever metallic structure.

Figure 5:
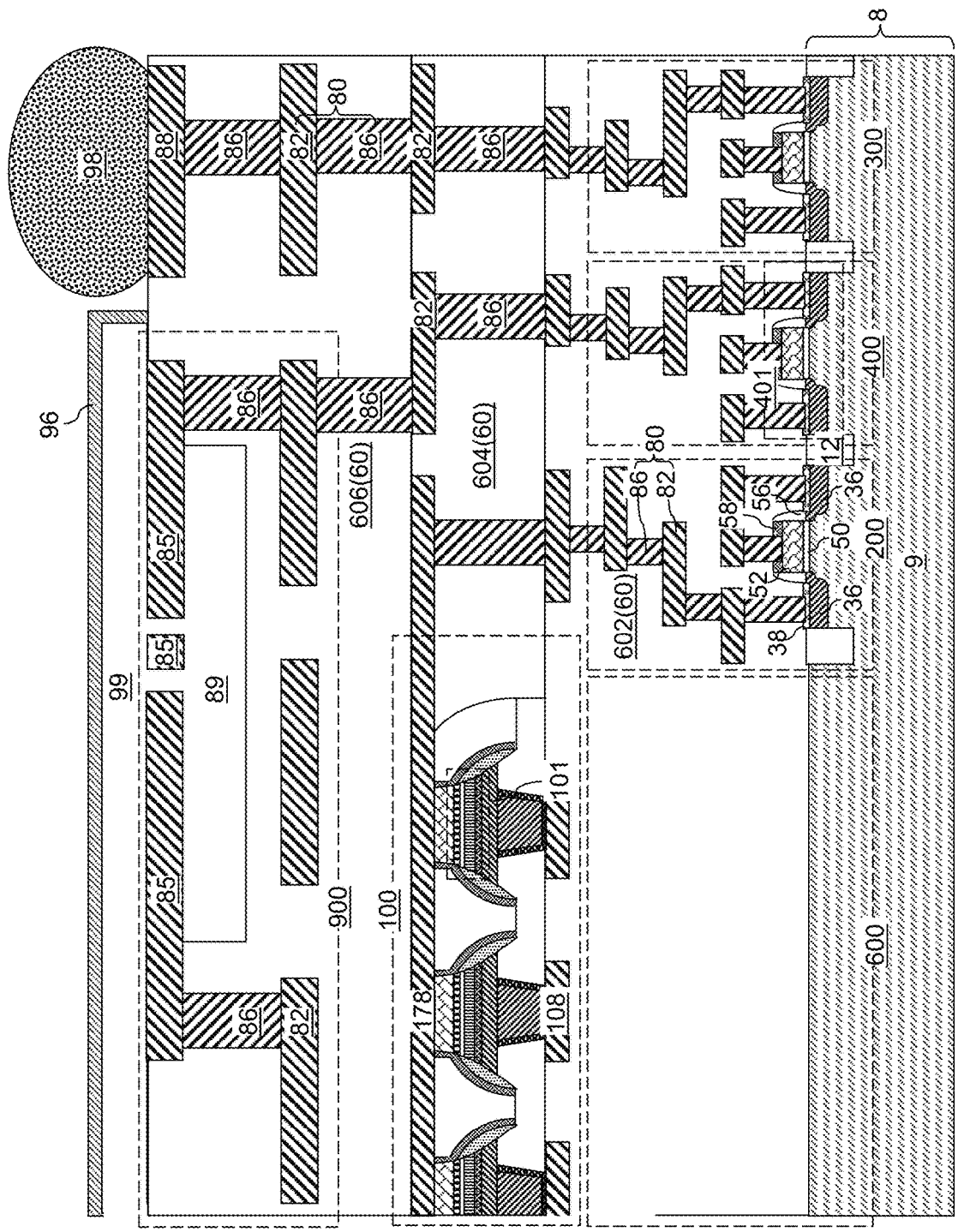
FIG. 5 is a vertical cross-sectional view of the exemplary structure after formation of a cap and solder material portions according to an embodiment of the present disclosure.

Referring to FIG. 5, a cap 96 may be optionally attached to the top side of the upper-level dielectric material layers 606 in a manner that covers all, or most, of the NEM devices. An overlying cavity 99 may be formed between the cap and the NEM devices. The height of the overlying cavity 99 may be in a range from 100 nm to 5 microns, such as from 200 nm to 2 microns, although lesser and greater heights may also be used.

Solder material portions 98 may be attached to the metallic bonding structures 88. The solder material portions 98 may be subsequently used to attach the semiconductor die including the exemplary structure to another structure such as an interposer or a packaging substrate.

Figure 6A:
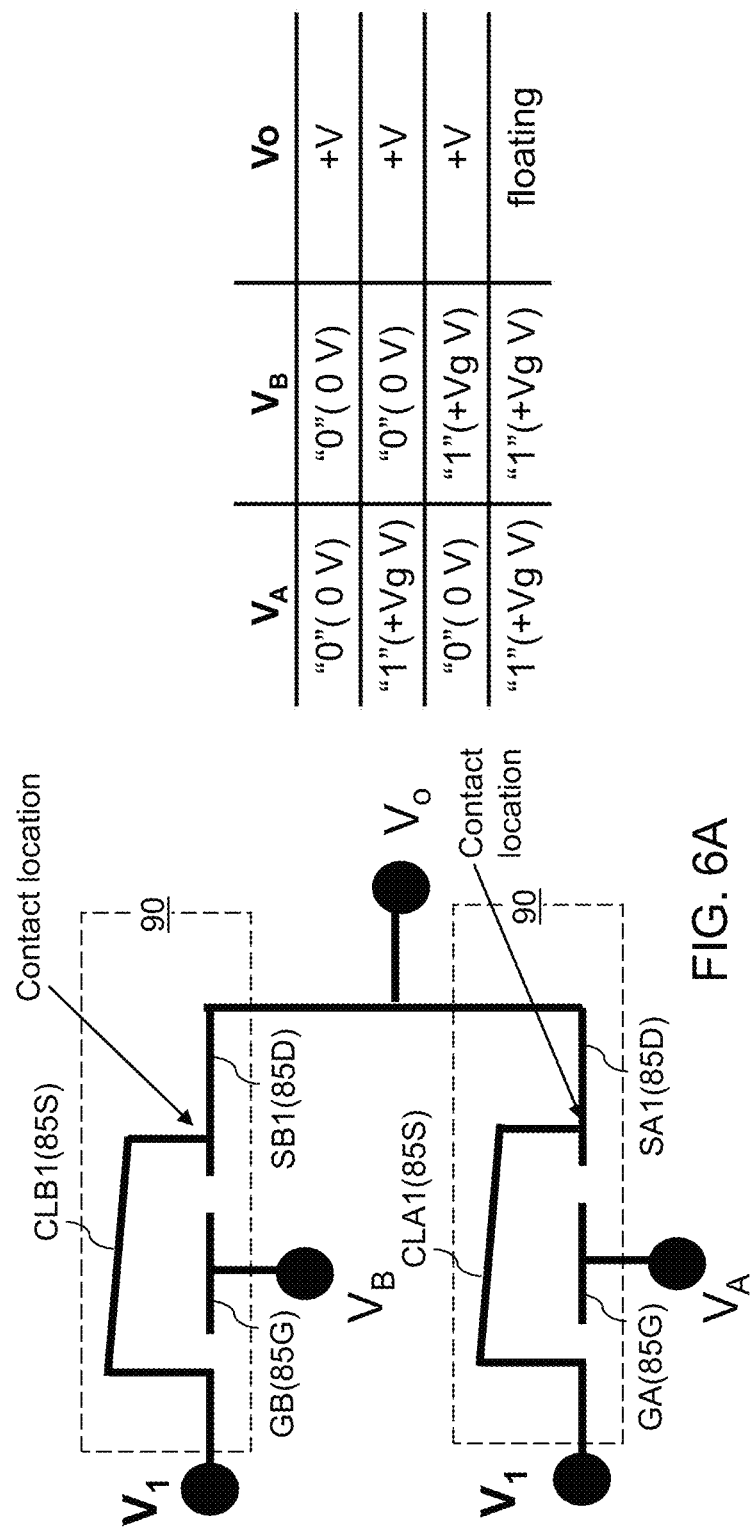
FIG. 6A is a circuit schematic of a parallel connection of two gated nanoelectromechanical switches and its logic table according to an embodiment of the present disclosure.

Referring to FIG. 6A, a circuit schematic of a parallel connection of two gated nanoelectromechanical switches 90 and an associated logic table are shown according to an embodiment of the present disclosure. The two gated nanoelectromechanical switches 90 are connected to each other in a parallel connection between a source electrode that applies a positive source voltage $+V_1$ and a common output node at which an output voltage Vo is generated. Each of the gated nanoelectromechanical switches 90 comprises a respective source electrode 85S comprising a cantilever (CLA1 or CLB1) having a free end, a respective drain electrode 85D comprising a stationary metallic structure (SA1 or SB1) that is proximate to the free end, and a respective gate electrode 85G (represented by the node GA or by the node GB) that is proximate to a surface of the respective source electrode 85S and is not in contact with the respective source electrode 85S.

In the illustrated circuit, the voltage applied to the source electrodes 85S may be a positive source voltage $+V_1$, and the two gated nanoelectromechanical switches 90 may be normally closed, i.e., provides electrical connection between a source electrode 85S and a drain electrode 85D by direct physical contact between the source electrode 85D and the drain electrode 85D while the gate input voltage ($V_A$ or $V_B$) applied to the gate electrode 85G is zero volt. When the gate input voltage ($V_A$ or $V_B$) becomes a positive gate voltage (such as a +Vg V) that is sufficient to repel the positively charged cantilever (CLA1 or CLB1) from the gate electrode 85G, the cantilever (CLA1 or CLB1) deforms and the physical contact between the (CLA1 or CLB1) and a respective stationary metallic structure (SA1 or SB1) becomes broken.

In one embodiment, a positive voltage such as +Vg V may be applied to the gate electrode (GA or GB) for a logical "1" input for a gate bias voltage, and 0 V may be applied to the gate electrode (GA or GB) for a logical "0" for the gate bias voltage. The positive gate voltage +Vg V may be in a range from 2 V to 100 V, such as from 5 V to 30 V. In the NEM circuit of FIG. 6A that includes a parallel connection of the two gated nanoelectromechanical switches 90, both a first gate electrode GA and a second gate electrode GB needs to be charged with positive gate voltages to repel the two positively charged cantilever (CLA1 or CLB1) from both contact location in order to make the output node Vo electrically floating. In other words, presence of one or more closed switches due to a zero voltage applied to either of the two gate electrodes (GA and GB) causes the output voltage Vo to be the positive source voltage +$V_1$ (which is the voltage that is applied to both of the cantilevers (CLA1 and CLB1). Only application of positive gate voltages to both of the two gate electrodes (GA and GB) causes the output voltage Vo to be an electrically floating. Hence, the output table of FIG. 6A. The nanoelectromechanical device of FIG. 6A generates a modified NAND output in which the output is floating when all gate inputs are logical "1" s. The Nanoelectromechanical device of FIG. 6A may be modified to provide a parallel connection of N nanoelectromechanical switches 90 that generates a modified NAND output in which the output is floating when all gate inputs are logical "1"s and in which N is any positive integer greater than 1.

Figure 6B:
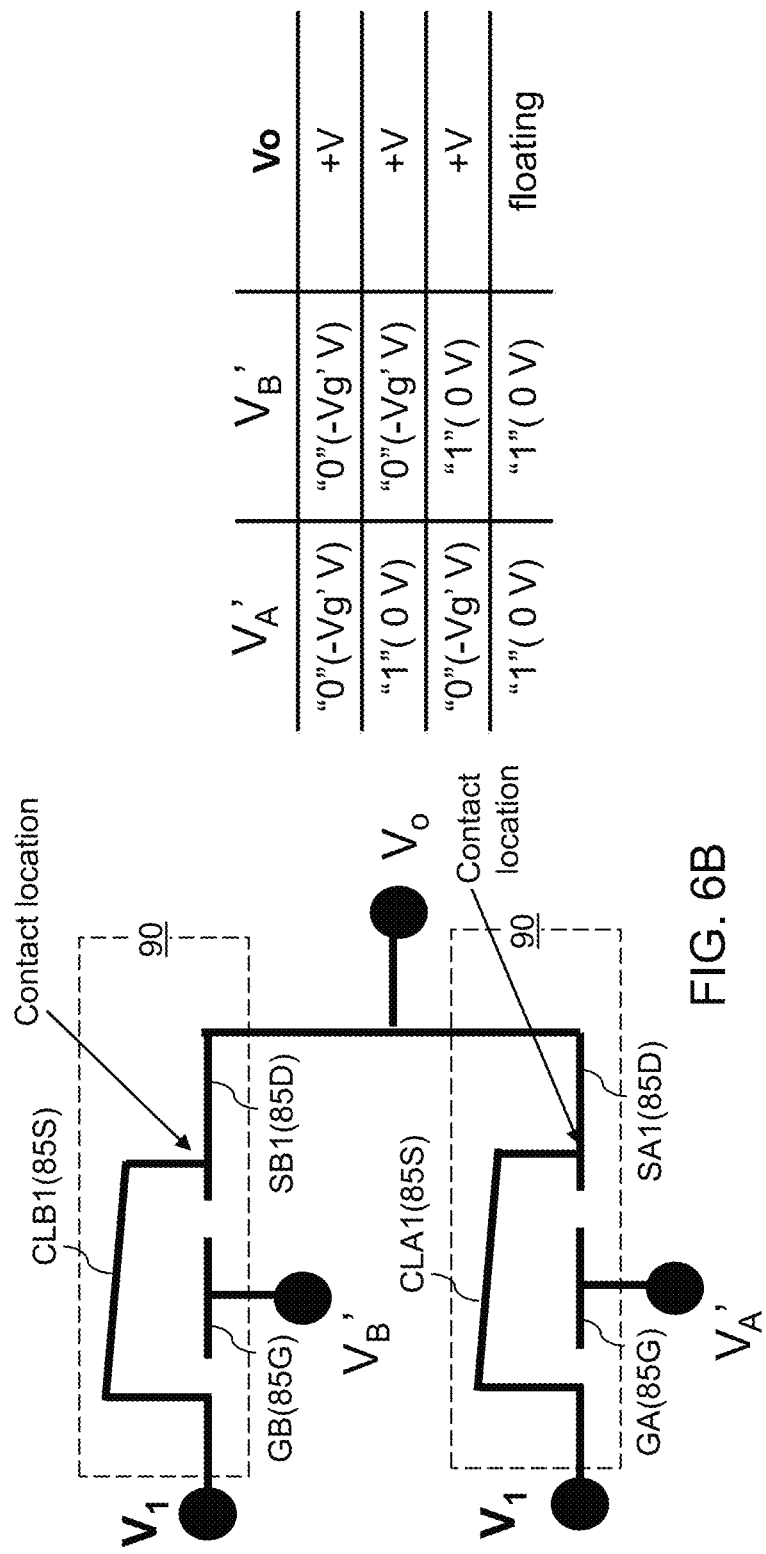
FIG. 6B is a circuit schematic of an alternative configuration of a parallel connection of two gated nanoelectromechanical switches and its logic table according to an embodiment of the present disclosure.

Referring to FIG. 6B, a circuit schematic of an alternative configuration of a parallel connection of two gated nanoelectromechanical switches 90 and an associated logic table are shown according to an embodiment of the present disclosure. In the alternative configuration, the two gated nanoelectromechanical switches 90 may be formed in a configuration in which the two gated nanoelectromechanical switches 90 are open when the gate electrodes (GA and GB) are not electrically biased, i.e., are at 0 V and does not cause deformation of the cantilevers. The two gated nanoelectromechanical switches 90 are connected to each other in a parallel connection between a source electrode that applies a positive source voltage +$V_1$ and a common output node at which an output voltage Vo is generated. Each of the gated nanoelectromechanical switches 90 comprises a respective source electrode 85S comprising a cantilever (CLA1 or CLB1) having a free end, a respective drain electrode 85D comprising a stationary metallic structure (SA1 or SB1) that is proximate to the free end, and a respective gate electrode 85G (represented by the node GA or by the node GB) that is proximate to a surface of the respective source electrode 85S and is not in contact with the respective source electrode 85S.

In the illustrated circuit, the voltage applied to the source electrodes 85S may be a positive source voltage +$V_1$, and the two gated nanoelectromechanical switches 90 may be normally open, i.e., provides electrical disconnection between a source electrode 85S and a drain electrode 85D by the absence of direct physical contact between the source electrode 85D and the drain electrode 85D while the gate input voltage ($V_A$ or $V_B$) applied to the gate electrode 85G is zero volt. In this embodiment, a negative gate voltage shifting scheme may be used to generate suitable gate bias voltages.

In one embodiment, a negative voltage such as −Vg' V may be applied to the gate electrode (GA or GB) for a logical "0" input for a gate bias voltage, and 0 V may be applied to the gate electrode (GA or GB) for a logical "1" for the gate bias voltage. When any of the gate input voltages ($V_A$ and $V_B$) becomes a negative gate voltage (such as a −Vg' V) that is sufficient to pull the positively charged cantilever (CLA1 or CLB1) toward a gate electrode 85G, the cantilever (CLA1 or CLB1) deforms and the cantilever (CLA1 or CLB1) contacts respective stationary metallic structure (SA1 or SB1). The negative gate voltage −Vg' V may be in a range from −100 V to −2 V, such as from −30 V to −5 V. In the NEM circuit of FIG. 6B that includes a parallel connection of the two gated nanoelectromechanical switches 90, both a first gate electrode GA and a second gate electrode GB needs to be at a logical "1" (such as a zero voltage) to electrically disconnect both of the two positively charged cantilever (CLA1 or CLB1) from the output node and to make the output node Vo electrically floating. In other words, presence of one or more closed switches due to a negative bias voltage applied to either of the two gate electrodes (GA and GB) causes the output voltage Vo to be the positive source voltage +$V_1$ (which is the voltage that is applied to both of the cantilevers (CLA1 and CLB1). Only application of the voltage representing a logical "1" (such as 0 V) to both of the two gate electrodes (GA and GB) causes the output voltage Vo to be an electrically floating. Hence, the output table of FIG. 6B. The nanoelectromechanical device of FIG. 6B generates a modified NAND output in which the output is floating when all gate inputs are logical "1"s. The Nanoelectromechanical device of FIG. 6B may be modified to provide a parallel connection of N nanoelectromechanical switches 90 that generates a modified NAND output in which the output is floating when all gate inputs are logical "1"s and in which Nis any positive integer greater than 1.

Figure 6C:
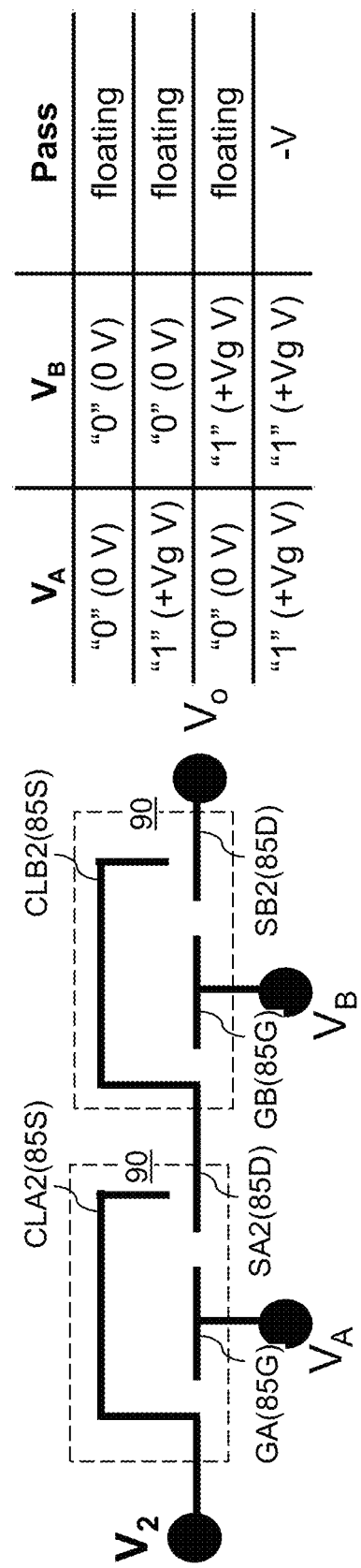
FIG. 6C is a circuit schematic of a series connection of two gated nanoelectromechanical switches and its logic table according to an embodiment of the present disclosure.

Referring to FIG. 6C, a circuit schematic of a series connection of two gated nanoelectromechanical switches 90 and its logic table are shown according to an embodiment of the present disclosure. The two gated nanoelectromechanical switches 90 are connected to each other in a series connection between a source electrode that applies a positive source voltage +$V_2$ and an output node at which an output voltage Vo is generated. Each of the gated nanoelectromechanical switches 90 comprises a respective source electrode 85S comprising a cantilever (CLA2 or CLB2) having a free end, a respective drain electrode 85D comprising a stationary metallic structure (SA2 or SB2) that is proximate to the free end, and a respective gate electrode 85G (represented by the node GA or by the node GB) that is proximate to a surface of the respective source electrode 85S and is not in contact with the respective source electrode 85S.

In the illustrated circuit, the voltage applied to the source electrodes 85S may be a positive source voltage +$V_2$, and the two gated nanoelectromechanical switches 90 may be normally open, i.e., causes electrical disconnection between a source electrode 85S and a drain electrode 85D while the gate input voltage ($V_A$ or $V_B$) applied to the gate electrode 85G is zero volt. When the gate input voltages ($V_A$ and $V_B$) become a positive gate voltage (such as a +Vg V) that is sufficient to pull the positively charged cantilevers (CLA1 and CLB1) toward the gate electrode 85G, the cantilevers (CLA1 and CLB1) deform and contact a respective stationary metallic structure (SA1 and SB1).

In one embodiment, a positive voltage such as +Vg V may be applied to the gate electrode (GA or GB) for a logical "1" input for a gate bias voltage, and 0 V may be applied to the gate electrode (GA or GB) for a logical "0" for the gate bias voltage. The positive gate voltage +Vg V may be in a range from 2 V to 100 V, such as from 5 V to 30 V. In the NEM circuit of FIG. 6C that includes a series connection of the two gated nanoelectromechanical switches 90, both a first gate electrode GA and a second gate electrode GB needs to be charged with positive gate voltages to pull the two positively charged cantilever (CLA1 or CLB1) to a respective contact location in order to make the output node Vo equal to the positive source voltage $V_2$. In other words, presence of one or more open switches due to a zero voltage applied to either of the two gate electrodes (GA and GB) causes the output voltage Vo to be electrically floating. Only application of positive gate voltages to both of the two gate electrodes (GA and GB) causes the output voltage Vo to be the same as the positive source voltage $V_2$. Hence, the output table of FIG. 6C. The nanoelectromechanical device of FIG. 6C generates a modified AND output in which the output is floating when any of the gate inputs includes a logical "0." The Nanoelectromechanical device of FIG. 6C may be modified to provide a series connection of N nanoelectromechanical switches 90 that generates a modified AND output in which the output is floating when any of the gate inputs includes a logical "0" and in which N is any positive integer greater than 1.

Figure 6D:
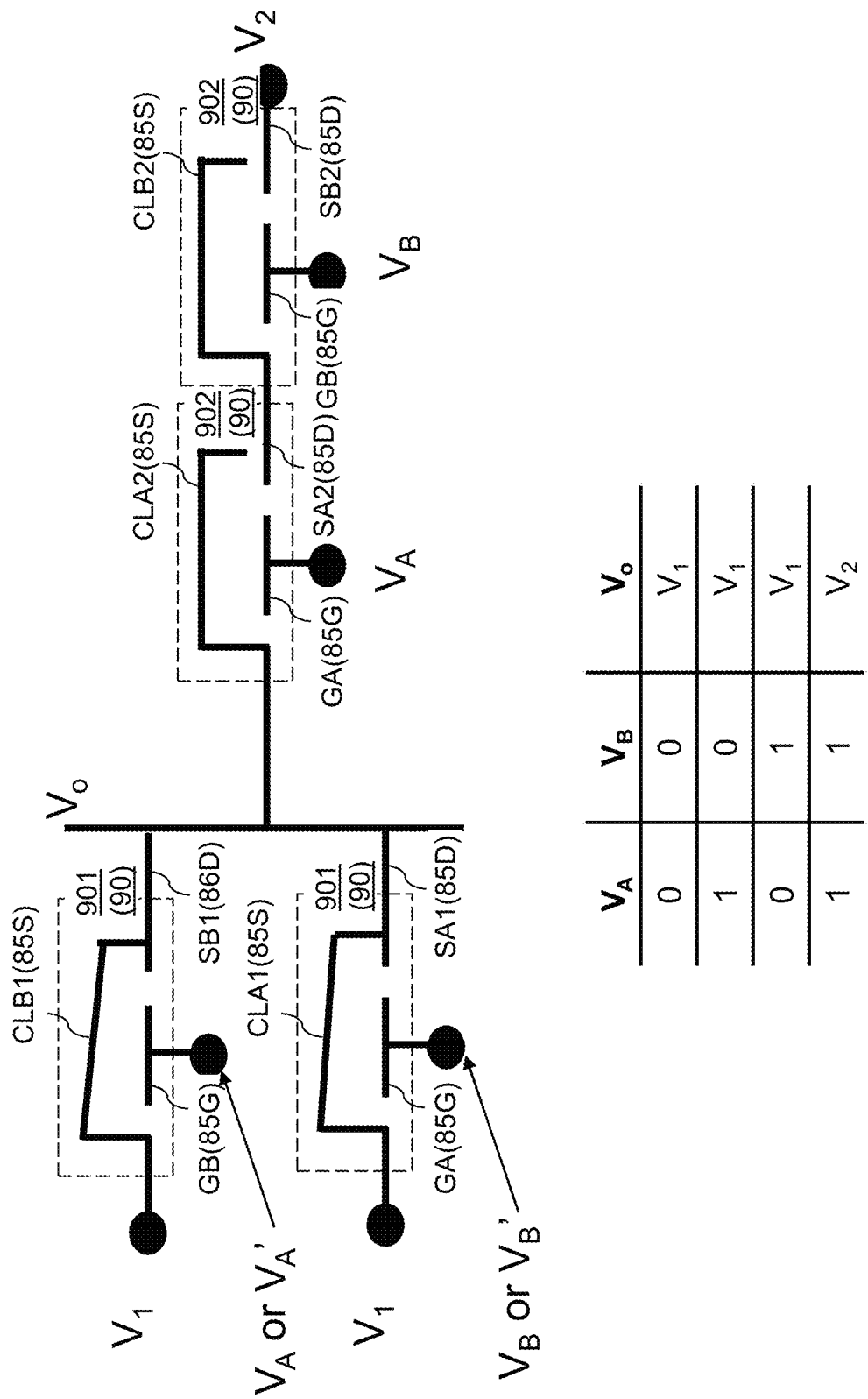
FIG. 6D is a circuit schematic of a composite nanoelectromechanical AND switch and its logic table according to an embodiment of the present disclosure.

Referring to FIG. 6D, a composite nanoelectromechanical AND switch and its logic table is illustrated according to an embodiment of the present disclosure. The composite nanoelectromechanical AND switch may be formed by combining the parallel connection of the N gated nanoelectromechanical switches 90 illustrated in FIG. 6A or in FIG. 6B and the series connection of the N gated nanoelectromechanical switches 90 illustrated in FIG. 6C such that the output node for generating the output voltage Vo is shared. In this embodiment, for all gate input conditions in which at least one gate input voltage includes a logical "0," the output voltage may be a first source bias voltage $V_1$; and for the gate input condition in which all gate input voltages include a logical "1," the output voltage may be a second source bias voltage $V_2$. Generally, the second source bias voltage $V_2$ is different from the first source bias voltage $V_1$.

The N gated nanoelectromechanical switches 90 illustrated in FIG. 6A or in FIG. 6B and incorporated into the composite nanoelectromechanical AND switch of FIG. 6D are herein referred to as N first gated nanoelectromechanical switches 901. The N gated nanoelectromechanical switches 90 illustrated in FIG. 6C and incorporated into the composite nanoelectromechanical AND switch of FIG. 6D are herein referred to as N second gated nanoelectromechanical switches 902.

In embodiments in which the composite nanoelectromechanical AND switch in FIG. 6D includes a modified NAND nanoelectromechanical switch described with reference to FIG. 6A, the gate inputs for the series connection of the N second gated nanoelectromechanical switches 902 (that forms a modified AND nanoelectromechanical switch) may be directly connected to a respective gate input in the modified NAND nanoelectromechanical switch. In embodiments in which the composite nanoelectromechanical AND switch in FIG. 6D includes a modified NAND nanoelectromechanical switch described with reference to FIG. 6B, gate inputs for the modified NAND nanoelectromechanical switch may be level-shifted relative to the gate inputs for the series connection of the N second gated nanoelectromechanical switches 902 (that forms a modified AND nanoelectromechanical switch).

While the present disclosure is illustrated using examples in which N is 2, N may be any positive integer greater than 1. For example, N may be in a range from 2 to 30.

Figure 7:
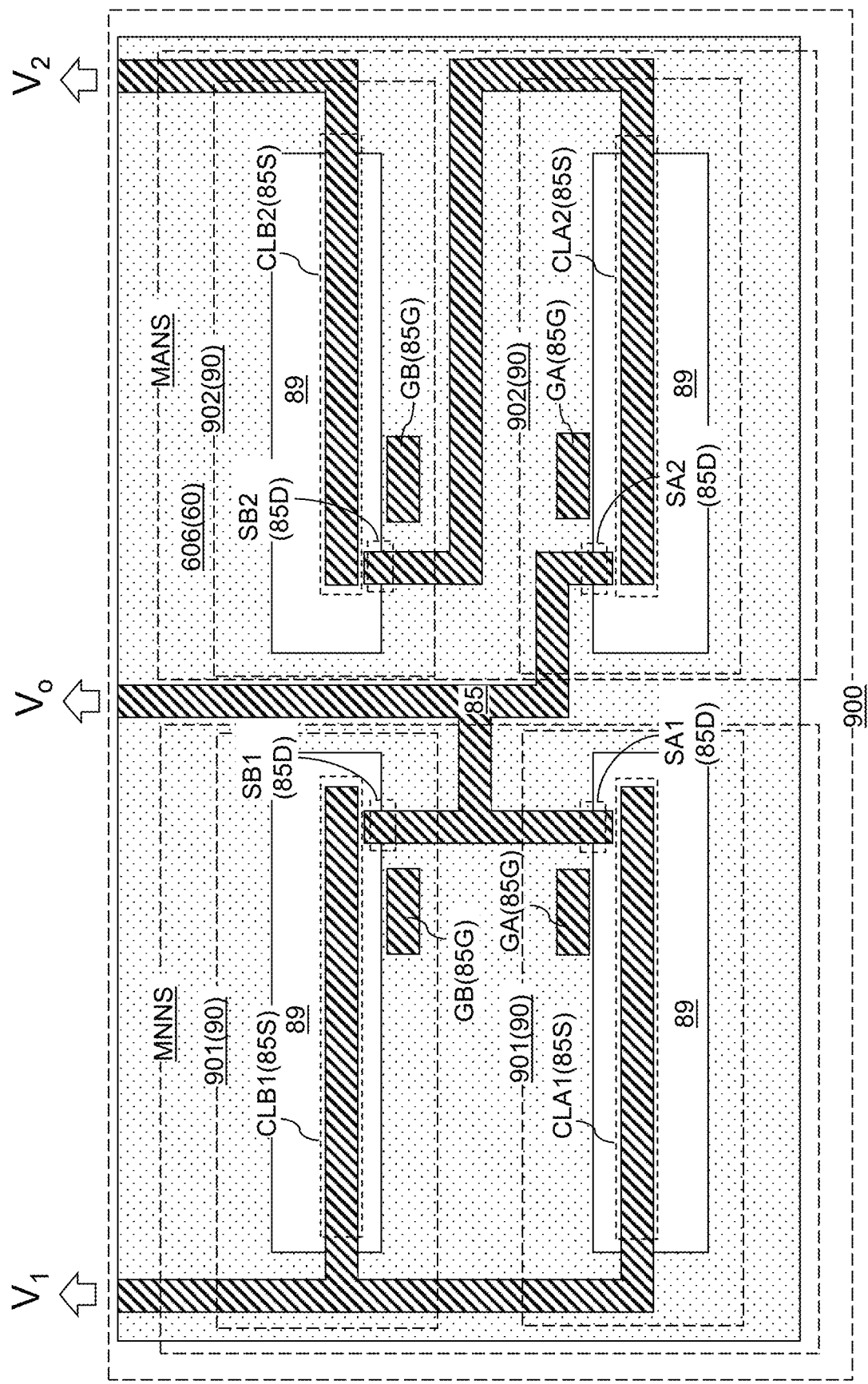
FIG. 7 is a top-down view of a composite nanoelectromechanical AND switch in the exemplary structure of FIG. 5 according to an embodiment of the present disclosure.

FIG. 7 is a top-down view of a composite nanoelectromechanical AND switch in the exemplary structure of FIG. 5 according to an embodiment of the present disclosure. The composite nanoelectromechanical AND switch embodies the composite nanoelectromechanical AND switch illustrated in FIG. 6D.

The composite nanoelectromechanical AND switch may include a modified NAND nanoelectromechanical switch MNNS and a modified AND nanoelectromechanical switch MANS that are configured to share a stationary metallic structure that is connected to the output node that generates the output voltage Vo. The modified NAND nanoelectromechanical switch MNNS includes a parallel connection of N first gated nanoelectromechanical switches 901, each including a cantilever (CLA1 or CLB1) embodying a respective source electrode 85S and including a stationary metallic structure (SA1 or SB1) embodying a respective drain electrode 85D. The modified AND nanoelectromechanical switch MANS includes a series connection of N second gated nanoelectromechanical switches 901, each including a cantilever (CLA2 or CLB2) embodying a respective source electrode 85S and including a stationary metallic structure (SA2 or SB2) embodying a respective drain electrode 85D. The source electrodes 85S of the N first gated nanoelectromechanical switches 901 are connected to an electrical node that provides the first source bias voltage $V_1$. The source electrodes 85S of one of the N second gated nanoelectromechanical switches 901 is connected to an electrical node that provides the second source bias voltage $V_2$.

Generally, a plurality of composite nanoelectromechanical AND switches may be formed to access the access lines (such as the first access lines 178 and/or the second access lines 108 illustrated in FIGS. 1A and 2-5). The total number of the composite nanoelectromechanical AND switches may be the same as the total number of the access lines. For example, in embodiments in which an P×Q array of memory cells 101 is arranged to be randomly accessible through P rows of word lines and Q columns of bit lines, a first decoder circuit including Q composite nanoelectromechanical AND switches may be provided to function as a bit line decoder circuit, and a second decoder circuit including P composite nanoelectromechanical AND switches may be provided to function as a word line decoder circuit. In embodiments in which the integer Q is greater than $2^{(N-1)}$ and is not greater than $2^N$ for a positive integer N, an N bit address may be used to address each of the Q composite nanoelectromechanical AND switches. If the integer P is greater than $2^{(M-1)}$ and is not greater than $2^M$ for a positive integer M, an M bit address may be used to address each of the Q composite nanoelectromechanical AND switches. In an illustrative example, M may be an integer in a range from 2 to 20, N may be an integer in a range from 2 to 20, P may be an integer in a range from $2^2$ to $2^{20}$, and Q may be an integer in a range from $2^2$ to $2^{20}$.

Figure 8:
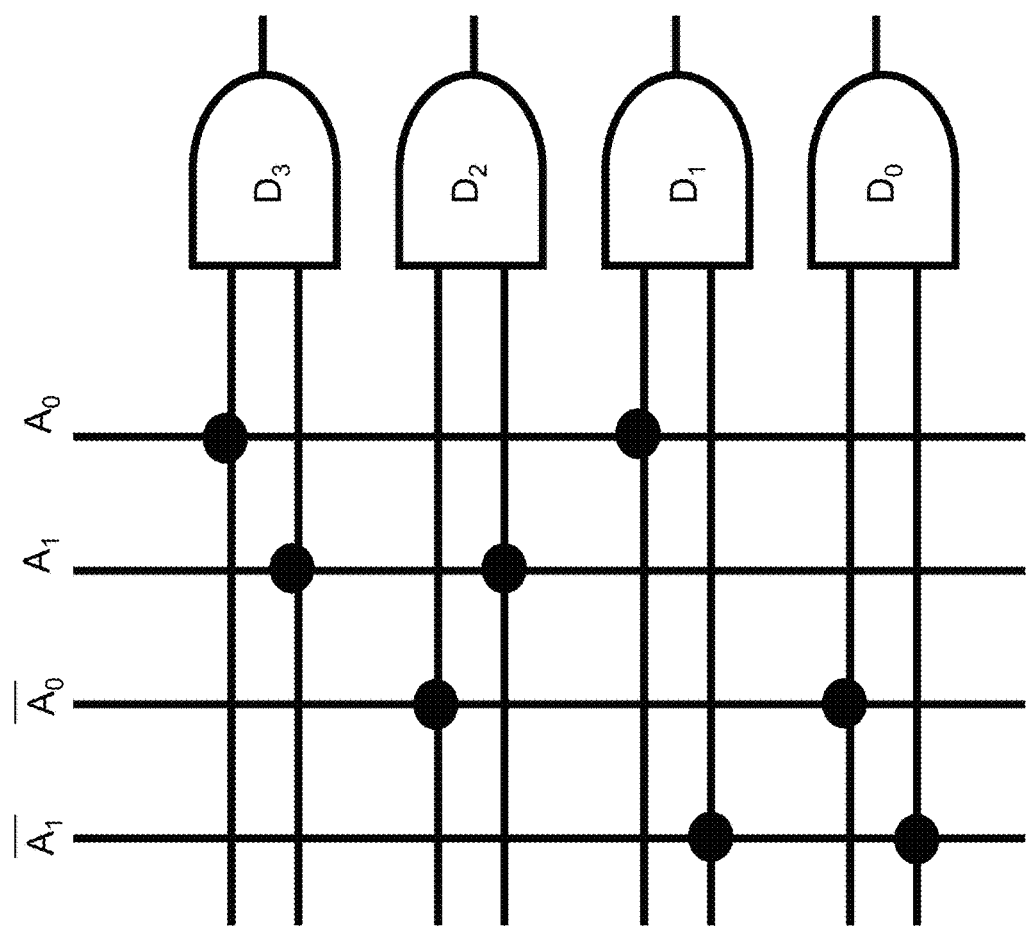
FIG. 8 is a circuit schematic of an exemplary nanoelectromechanical decoder circuit according to an embodiment of the present disclosure.

Referring to FIG. 8, a circuit schematic is illustrated for an exemplary nanoelectromechanical decoder circuit including an N bit address system and including Q composite nanoelectromechanical AND switches is illustrated. In the illustrated example, N is 2 and Q is 4. The Q composite nanoelectromechanical AND switches are labeled as $D_0$, $D_1$, $D_2$, and $D_3$. Two primary address bits are labeled as $A_0$ and $A_1$. Two complementary address bits are labeled as $\overline{A}_1$ and $\overline{A}_0$. The signals for the address bits and the complementary address bits may be generated by the address buffer transistors 401 located in the address buffer region 400 illustrated in FIGS. 1A and 2-5, and may be transmitted to metallic structures (such as the NEM device-level metal line structures 85 illustrated in FIGS. 1A and 2-5) embodying the gate electrodes 85G of the various nanoelectromechanical switches 90 (illustrated in FIGS. 6D and 7) in the nanoelectromechanical decoder circuit.

The nanoelectromechanical decoder circuit of the present disclosure may be used as a bit line decoder circuit, and/or as a word line decoder circuit. While the present disclosure is described using an embodiment in which N is 2 and Q is 4, N and Q (and M and P) may be generally larger numbers as discussed above. In an illustrative example, a bit line decoder circuit configured to address Q bit lines using an N bit address system may be provided, and a word line decoder circuit configured to address P word lines using an M bit address system may be provided.

Figure 9A:
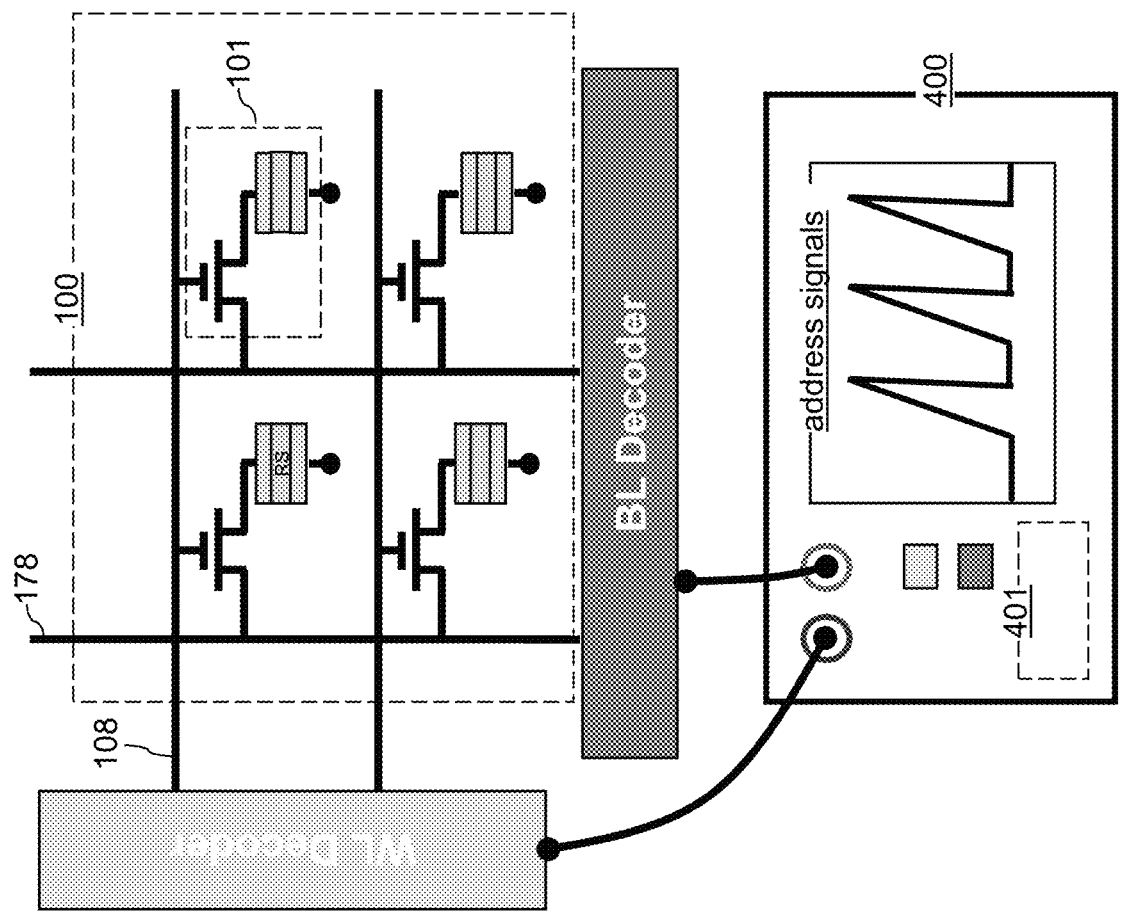
FIG. 9A is a first exemplary circuit schematic of a two-dimensional array of memory cells and decoder circuits according to an embodiment of the present disclosure.

FIG. 9A is a first exemplary circuit schematic of a two-dimensional array of memory cells 101 and decoder circuits according to an embodiment of the present disclosure. Each memory cell 101 may optionally include a cell access transistor, which may be a thin film transistor using a semiconducting metal oxide channel and formed within the memory-level dielectric material layer 604 (illustrated, for example, in FIGS. 1A and 2-5).

Generally, a plurality of decoder circuits may be used, each of which may comprise a respective nanoelectromechanical decoder circuit. A first decoder circuit may be configured to randomly access a selected first access line 178 (such as a selected bit line) selected from N first access lines. A second decoder circuit may be configured to randomly access a selected second access line 108 (such as a selected word line) selected from M first access lines.

Address output signals may be generated from the address buffer transistors 401 provided in the address buffer region 400. The address buffer transistors 401 may generate a bit line selection signal for the bit line decoder, which activates a selected bit line. The bit line selection signal may be in the form of suitable voltages applied to the metal lines configured to transmit the primary address bits and the complementary address bits. In one embodiment, N primary address bits and N complementary address bits may be generated for the bit line selection signal.

The address buffer transistors 401 may generate a word line selection signal for the word line decoder, which activates a selected word line. The word line selection signal may be in the form of suitable voltages applied to the metal lines configured to transmit the primary address bits and the complementary address bits to the word line decoder. In one embodiment, M primary address bits and M complementary address bits may be generated for the bit line selection signal.

Figure 9B:
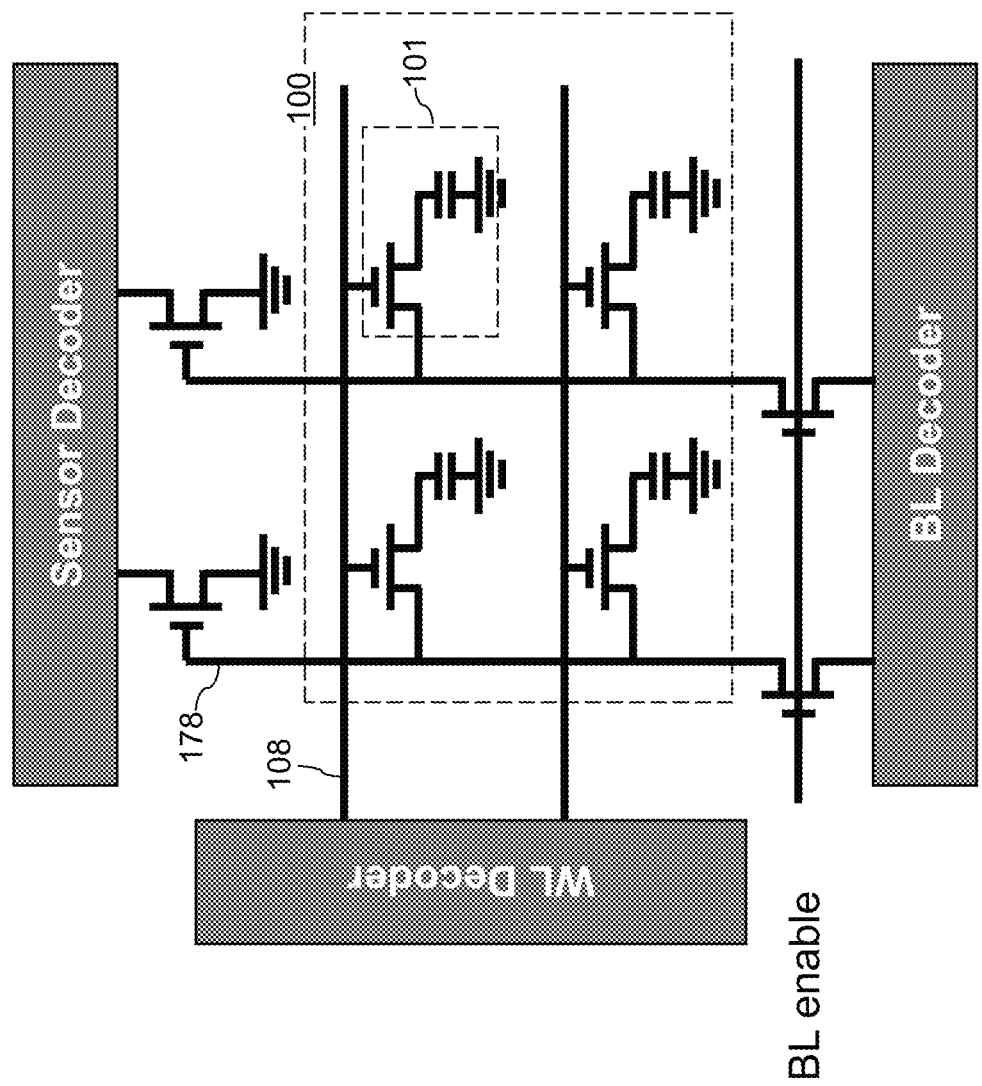
FIG. 9B is a second exemplary circuit schematic of a two-dimensional array of memory cells and decoder circuits according to an embodiment of the present disclosure.

FIG. 9B is a second exemplary circuit schematic of a two-dimensional array of memory cells 101 and decoder circuits according to an embodiment of the present disclosure. The nanoelectromechanical decoder circuit of the present disclosure may also be used as a sensor decoder circuit. In some embodiments, the bit line decoder circuit and the sensor decoder circuit may use an identical addressing system because the bit line decoder and the sensor decoder are connected to a same set of bit lines (i.e., the first access lines 178). In this embodiment, a same set of address buffer transistors 401 may be used to control the bit line decoder circuit and the sensor decoder circuit.

Referring collectively to FIGS. 1A-9B, the nanoelectromechanical decoder circuit including composite nanoelectromechanical AND switches and providing a composite logical AND gate may be used to address any array of memory cells 101 using at least one set of access lines (178, 108). Such memory cells 101 may be, but do not have to be, dynamic random access memory cells, resistive random access memory cells, magnetic tunnel junction random access memory cells, or ferroelectric random access memory cells. The total number of output signals that the address buffer transistors 401 generate may be two times the number of bits in the address system, i.e., 2N for an N bit address system. Thus, the area occupied by the address buffer transistors 401 may be small, and excess areas generated by reduction in the area occupied by the address buffer transistors 401 may be advantageously used to provide additional semiconductor devices. In other word, the area of the non-memory device region 600 illustrated in FIGS. 1A and 2-5 may be increased through reduction of the area of the address buffer region 400.

Referring collectively to FIGS. 1A-9B and according to various embodiments of the present disclosure, a device structure is provided, which comprises: a two-dimensional array of memory cells 101 embedded in a memory-level dielectric layer 604 and overlying a substrate 8; first access lines 178 electrically connected to a respective row of memory cells 101 within the two-dimensional array; and a first decoder circuit comprising first cantilever nanoelectromechanical devices that overlie the two-dimensional array of memory cells 101, are embedded in upper dielectric material layers 606, and have output nodes that are electrically connected to a respective first access line selected from the first access lines 178.

In one embodiment, each of the first cantilever electromechanical devices is configured to generate a respective output that activates, or deactivates, a respective first access line 178; and the first decoder circuit is configured to active a selected first access line 178 selected from the first access lines 178 without activating any other first access line 178 than the selected first access line 178.

In one embodiment, each of the first cantilever nanoelectromechanical devices comprises: first gated nanoelectromechanical switches 901 that are connected to each other in a parallel connection between a first source electrode 85S and a common output node Vo; and second gated nanoelectromechanical switches 902 that are connected to each other in a series connection between a second source electrode 85S and the common output node Vo.

In one embodiment, each of the first gated nanoelectromechanical switches 901 and the second gated nanoelectromechanical switches 902 comprises: a respective source electrode 85S comprising a cantilever having a free end; a respective drain electrode 85D comprising a stationary metallic structure that is proximate to the free end; and a respective gate electrode 85G that is proximate to a surface of the respective source electrode 85S and is not in contact with the respective source electrode 85S.

In one embodiment, each of the first gated nanoelectromechanical switches 90 and the second gated nanoelectromechanical switches 90 comprises a cavity 89 in which the free end of the respective source electrode 85S is suspended and to which a surface portion of the stationary metallic structure is physically exposed.

In one embodiment, the first gated nanoelectromechanical switches 901 comprise first gate electrodes 85G; the second gated nanoelectromechanical switches 902 comprise second gate electrodes 85G; and each of the first gate electrodes 85G is electrically shorted (i.e., electrically connected) to a respective one of the second gate electrodes 85G.

In one embodiment, the first gated nanoelectromechanical switches 901 comprise first gate electrodes 85G; the second gated nanoelectromechanical switches 902 comprise second gate electrodes 85G; and voltages applied to the first gate electrodes 85G are level-shifted relative to voltages applied to the second gate electrodes 85G.

In one embodiment, the device structure comprises first address buffer transistors 401 located on the substrate 8 and configured to generate a set of output signals applied to each of the first gate electrodes 85G and the second gate electrodes 85G.

In one embodiment, the first address buffer transistors 401 are configured to generate an N-digit address output; and each of the first cantilever nanoelectromechanical devices comprises N first gated nanoelectromechanical switches 90 and N second gated nanoelectromechanical switches 90. In one embodiment, a total number of the first cantilever nanoelectromechanical devices within the first decoder circuit is in a range from $2^{(N-1)}+1$ to $2^N$.

In one embodiment, the first access lines 178 are bit lines, and the first decoder circuit comprise a bit line address decoder circuit.

In one embodiment, the device structure comprises: second access lines 108 electrically connected to a respective column of memory cells 101 within the two-dimensional array; and a second decoder circuit comprising second cantilever nanoelectromechanical devices that overlie the two-dimensional array of memory cells 101, are embedded in upper dielectric material layers 606, and have output nodes that are electrically connected to a respective second access line selected from the second access lines 108. In one embodiment, the second access lines 108 are word lines, and the second decoder circuit comprise a word line address decoder circuit.

According to another aspect of the present disclosure, a device structure is provided, which comprises: a two-dimensional array of memory cells 101 embedded in a memory-level dielectric layer 604 and overlying a substrate 8; first access lines 178 electrically connected to a respective row of memory cells 101 within the two-dimensional array; and a first decoder circuit comprising first cantilever nanoelectromechanical devices that overlie the two-dimensional array of memory cells 101 and configured to activate a selected first access line selected from the first access lines 178, wherein each of the first cantilever nanoelectromechanical devices comprises: first gated nanoelectromechanical switches 901 that are connected to each other in a parallel connection between a first source electrode 85S and a common output node Vo; and second gated nanoelectromechanical switches 902 that are connected to each other in a series connection between a second source electrode 85S and the common output node Vo.

In one embodiment, each of the first gated nanoelectromechanical switches 90 and the second gated nanoelectromechanical switches 90 comprises: a respective source electrode 85S comprising a cantilever having a free end; a respective drain electrode 85D comprising a stationary metallic structure that is proximate to the free end; and a respective gate electrode 85G that is proximate to a surface of the respective source electrode 85S and is not in contact with the respective source electrode 85S.

In one embodiment, each of the first gated nanoelectromechanical switches 90 and the second gated nanoelectromechanical switches 90 comprises a cavity 89 in which the free end of the respective source electrode 85S is suspended and to which a surface portion of the stationary metallic structure is physically exposed; and the device structure comprises a cap 96 covering each of the cavities 89 of the first gated nanoelectromechanical switches 901 and the second gated nanoelectromechanical switches 902.

Figure 10:
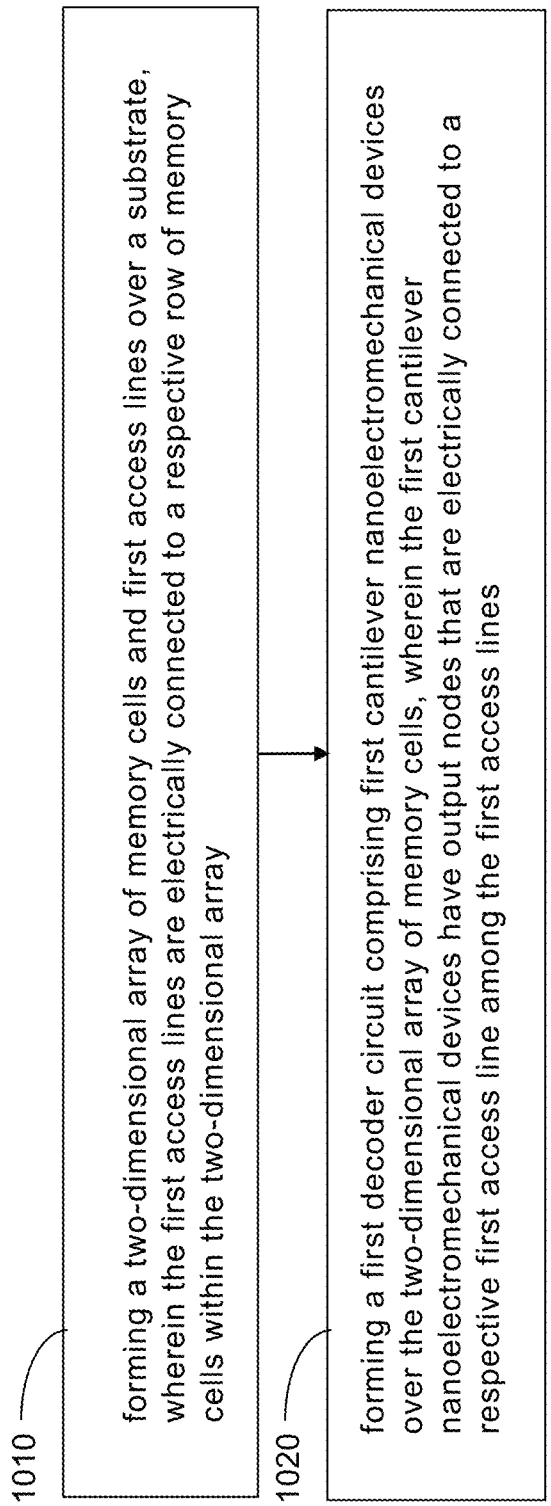
FIG. 10 is a flowchart that illustrates general processing steps for manufacturing a device structure according to an embodiment of the present disclosure.

Referring to FIG. 10, a flowchart illustrates general processing steps for manufacturing a device structure according to an embodiment of the present disclosure.

Referring to step 1010 and FIGS. 1A and 1B, a two-dimensional array of memory cells 101 and first access lines 178 may be formed over a substrate 8. The first access lines 178 are electrically connected to a respective row of memory cells 101 within the two-dimensional array.

Referring to step 1020 and FIGS. 2-9B, a first decoder circuit comprising first cantilever nanoelectromechanical devices may be formed over the two-dimensional array of memory cells 101. The first cantilever nanoelectromechanical devices have output nodes that are electrically connected to a respective first access line selected from the first access lines 178.

According to an aspect of the present disclosure, a combination of a parallel connection of cantilever NEM switches and a series connection of cantilever NEM switches may be used to provide a composite AND gate. The composite AND gates may be used to provide decoder circuits for selecting access lines for a two-dimensional array of memory cells 101. The decoder circuits may be built within the level of dielectric material layers 60, such as the level of the topmost dielectric material layer. As such, device areas may be freed at the level of field effect transistors, and additional areas may be allocated to form other semiconductor devices such as devices that are formed in the non-memory device region 600.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising:
a two-dimensional array of memory cells embedded in a memory-level dielectric layer and overlying a substrate;
a plurality of first access lines, wherein each of the plurality of access lines are electrically connected to a respective row of memory cells within the two-dimensional array; and
a first decoder circuit comprising a plurality of first cantilever nanoelectromechanical devices that overlie the two-dimensional array of memory cells, wherein the plurality of first cantilever nanoelectromechanical devices are embedded in upper dielectric material layers, and have output nodes that are electrically connected to a respective first access line selected from the plurality of first access lines.

2. The device structure of claim 1, wherein:
  each of the plurality of first cantilever electromechanical devices is configured to generate a respective output that activates, or deactivates, a respective first access line; and
  the first decoder circuit is configured to active a selected first access line selected from the plurality of first access lines without activating any other first access line than the selected first access line.

3. The device structure of claim 1, wherein each of the plurality of first cantilever nanoelectromechanical devices comprises:
  first gated nanoelectromechanical switches that are connected to each other in a parallel connection between a first source electrode and a common output node; and
  second gated nanoelectromechanical switches that are connected to each other in a series connection between a second source electrode and the common output node.

4. The device structure of claim 3, wherein each of the first gated nanoelectromechanical switches and the second gated nanoelectromechanical switches comprises:
  a respective source electrode comprising a cantilever having a free end;
  a respective drain electrode comprising a stationary metallic structure that is proximate to the free end; and
  a respective gate electrode that is proximate to a surface of the respective source electrode and is not in contact with the respective source electrode.

5. The device structure of claim 4, wherein each of the first gated nanoelectromechanical switches and the second gated nanoelectromechanical switches comprises a cavity in which the free end of the respective source electrode is suspended and to which a surface portion of the stationary metallic structure is physically exposed.

6. The device structure of claim 4, wherein:
  the first gated nanoelectromechanical switches comprise first gate electrodes;
  the second gated nanoelectromechanical switches comprise second gate electrodes; and
  each of the first gate electrodes is electrically connected to a respective one of the second gate electrodes.

7. The device structure of claim 4, further comprising first address buffer transistors located on the substrate and configured to generate a set of output signals applied to each of the first gate electrodes and the second gate electrodes.

8. The device structure of claim 7, wherein:
  the first address buffer transistors are configured to generate an N-digit address output; and
  each of the plurality of first cantilever nanoelectromechanical devices comprises N first gated nanoelectromechanical switches and N second gated nanoelectromechanical switches.

9. The device structure of claim 8, wherein a total number of the plurality of first cantilever nanoelectromechanical devices within the first decoder circuit is in a range from $2^{(N-1)}+1$ to $2^N$.

10. The device structure of claim 1, wherein the first access lines are bit lines, and the first decoder circuit comprise a bit line address decoder circuit.

11. The device structure of claim 1, further comprising:
  second access lines electrically connected to a respective column of memory cells within the two-dimensional array; and
  a second decoder circuit comprising a plurality of second cantilever nanoelectromechanical devices that overlie the two-dimensional array of memory cells, are embedded in upper dielectric material layers, and have output nodes that are electrically connected to a respective second access line selected from the second access lines.

12. The device structure of claim 11, wherein the second access lines are word lines, and the second decoder circuit comprise a word line address decoder circuit.

13. A device structure comprising:
  a two-dimensional array of memory cells embedded in a memory-level dielectric layer and overlying a substrate;
  a plurality of first access lines, wherein each of the plurality of first access lines is electrically connected to a respective row of memory cells within the two-dimensional array; and
  a first decoder circuit comprising a plurality of first cantilever nanoelectromechanical devices that overlie the two-dimensional array of memory cells and configured to activate a selected first access line selected from the plurality of first access lines, wherein each of the plurality of first cantilever nanoelectromechanical devices comprises:
    first gated nanoelectromechanical switches that are connected to each other in a parallel connection between a first source electrode and a common output node; and
    second gated nanoelectromechanical switches that are connected to each other in a series connection between a second source electrode and the common output node.

14. The device structure of claim 13, wherein each of the first gated nanoelectromechanical switches and the second gated nanoelectromechanical switches comprises:
  a respective source electrode comprising a cantilever having a free end;
  a respective drain electrode comprising a stationary metallic structure that is proximate to the free end; and
  a respective gate electrode that is proximate to a surface of the respective source electrode and is not in contact with the respective source electrode.

15. The device structure of claim 14, wherein:
  each of the first gated nanoelectromechanical switches and the second gated nanoelectromechanical switches comprises a cavity in which the free end of the respective source electrode is suspended and to which a surface portion of the stationary metallic structure is physically exposed; and
  the device structure comprises a cap covering each of the cavities of the first gated nanoelectromechanical switches and the second gated nanoelectromechanical switches.

16. The device structure of claim 13, wherein the memory cells are selected from:
  dynamic random access memory cells;
  resistive random access memory cells;
  magnetic tunnel junction random access memory cells; and
  ferroelectric random access memory cells.

17. A method of forming a device structure, the method comprising:
  forming a two-dimensional array of memory cells and first access lines over a substrate, wherein the first access lines are electrically connected to a respective row of memory cells within the two-dimensional array; and
  forming a first decoder circuit comprising first cantilever nanoelectromechanical devices over the two-dimensional array of memory cells, wherein the first cantilever nanoelectromechanical devices have output nodes that are electrically connected to a respective first access line selected from the first access lines.

18. The method of claim 17, wherein each of the first cantilever nanoelectromechanical devices comprises:
   first gated nanoelectromechanical switches that are connected to each other in a parallel connection between a first source electrode and a common output node; and
   second gated nanoelectromechanical switches that are connected to each other in a series connection between a second source electrode and the common output node.

19. The method of claim 18, wherein each of the first gated nanoelectromechanical switches and the second gated nanoelectromechanical switches comprises:
   a respective source electrode comprising a cantilever having a free end;
   a respective drain electrode comprising a stationary metallic structure that is proximate to the free end; and
   a respective gate electrode that is proximate to a surface of the respective source electrode and is not in contact with the respective source electrode.

20. The method of claim 17, further comprising:
   forming upper-level dielectric material layers over the two-dimensional array of memory cells;
   forming sacrificial material portions within upper portions of the upper-level dielectric material layers;
   forming cantilever metallic structures and metal lines in the upper-level dielectric material layers and the sacrificial material portions; and
   removing the sacrificial material portions, wherein free ends of the cantilever metallic structures are exposed to cavities formed by removal of the sacrificial material portions, and wherein each of the first cantilever nanoelectromechanical devices comprises a respective plurality of cantilever gated nanoelectromechanical switches including a respective one of the cantilever metallic structures.

* * * * *